(12) United States Patent
Wathen et al.

(10) Patent No.: US 8,810,108 B2
(45) Date of Patent: Aug. 19, 2014

(54) MULTI-MODE BULK-ACOUSTIC-WAVE RESONATORS

(75) Inventors: Adam Wathen, Atlanta, GA (US); Farasat Munir, Atlanta, GA (US); Anthony J. Dickherber, Derwood, MD (US); Christopher D. Corso, Decatur, GA (US); William Hunt, Decatur, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 419 days.

(21) Appl. No.: 13/228,593

(22) Filed: Sep. 9, 2011

(65) Prior Publication Data

US 2012/0062068 A1    Mar. 15, 2012

Related U.S. Application Data

(60) Provisional application No. 61/381,233, filed on Sep. 9, 2010, provisional application No. 61/382,680, filed on Sep. 14, 2010.

(51) Int. Cl.
*H01L 41/09* (2006.01)
*H03H 9/00* (2006.01)

(52) U.S. Cl.
USPC ............................ 310/321; 310/320; 333/186

(58) Field of Classification Search
USPC ......................... 310/320, 321, 326, 327, 366; 333/186–192
See application file for complete search history.

(56) References Cited

U.S. PATENT DOCUMENTS

| | | | |
|---|---|---|---|
| 6,448,695 B2 * | 9/2002 | Milsom | 310/334 |
| 7,719,388 B2 * | 5/2010 | Schmidhammer | 333/187 |
| 7,770,274 B2 * | 8/2010 | Sano et al. | 29/25.35 |
| 2007/0096851 A1 * | 5/2007 | Uno et al. | 333/191 |
| 2008/0247264 A1 * | 10/2008 | Gabl et al. | 366/127 |
| 2011/0121689 A1 * | 5/2011 | Grannen et al. | 310/357 |

* cited by examiner

*Primary Examiner* — Thomas Dougherty
(74) *Attorney, Agent, or Firm* — Troutman Sanders LLP; Ryan A. Schneider; Dustin B. Weeks

(57) ABSTRACT

The various embodiments of the present disclosure relate generally bulk-acoustic-wave resonators. An exemplary embodiment of the present invention provides a bulk-acoustic-wave resonator comprising an acoustic reflector, a substantially c-axis oriented hexagonal crystal structure, and a plurality of electrodes. The crystal structure is solidly-mounted to the acoustic reflector. The bulk-wave resonator resonates in at least two non-harmonically-related operational modes.

20 Claims, 8 Drawing Sheets

MULTI-MODE BULK-ACOUSTIC-WAVE RESONATORS

CROSS-REFERENCE TO RELATED APPLICATIONS

This application claims the benefit of U.S. Provisional Application Ser. No. 61/381,233, filed on 9 Sep. 2010, and U.S. Provisional Application Ser. No. 61/382,680, filed on 14 Sep. 2010, which are both incorporated herein by reference in their entireties as if fully set forth below.

TECHNICAL FIELD OF THE INVENTION

The various embodiments of the present disclosure relate generally to resonators. More particularly, the various embodiments of the present invention are directed to bulk-acoustic-wave resonators that simultaneously operate in multiple non-harmonically-related modes.

BACKGROUND OF THE INVENTION

Advances in piezoelectric thin film deposition technology have led to the creation of advanced Bulk-Acoustic-Wave ("BAW") devices that enable GHz range acoustic resonators much higher than Quartz-Crystal-Microbalance ("QCM") and Surface-Acoustic-Wave ("SAW") resonator frequencies. Hexagonal crystals structures serving as piezoelectric thin films, such as zinc oxide ("ZnO") and aluminum nitride ("AlN"), have been used to make film BAW resonators called Thin-Film-Bulk-Acoustic-Wave-Resonators ("FBARs"). FBARs comprise a piezoelectric thin film (a few hundred nanometers to a few micrometers) sandwiched between two electrodes. The whole structure is supported by another layer (a few micrometers thick) to provide mechanical ruggedness. This configuration is called as composite BAW Resonator. The frequency at which a BAW resonator resonates is inversely proportional to the thickness of the device, and the mass sensitivity of the device as a sensor is proportional to a power of the unperturbed resonant frequency. Thus, thinner piezoelectric films are required for higher mass sensitivity application. Unfortunately, this configuration becomes very fragile for gigahertz range operation. For robustness, BAW resonators may employ a Solidly Mounted Resonator ("SMR") configuration. In SMRs, the piezoelectric film is deposited on top of an acoustic Bragg reflector. Conventionally, two different acoustic modes can be setup in the FBAR (i.e. the thickness shear mode ("TSM") or the longitudinal, i.e. the thickness extensional mode ("TEM")).

In conventional substantially c-axis oriented ZnO BAW resonators, the excitation of the TEM requires electrical citation parallel to the c-axis of the crystal structure, i.e. thickness excitation ("TE"). TE is accomplished by sandwiching the hexagonal crystal structure between two electrodes, thus providing an electric field parallel to the c-axis. On the other hand, excitation of the TSM requires electrical excitation orthogonal to the c-axis, i.e. lateral-field excitation ("LFE"). LFE is accomplished by placing the electrodes on the opposing sides of the hexagonal crystal structure to provide an electric field orthogonal to the c-axis. The acoustic wave resonating in the BAW will have a different velocity for TSM than for the TEM. Due to the different velocities of the TSM and TE modes, the corresponding wavelengths of the waves in any material are different. Thus, in conventional SMR BAWs, the reflector stack is either designed for the BAW to operate in the TSM or the TEM. In other words, a BAW operating in the TSM is typically not tuned for the TEM, and vice versa. Therefore different devices with different electrode and reflector designs are needed to excite the TSM and TEM bulk acoustic modes with each device optimized for a single mode.

Multiple modes excited in a single, solidly-mounted BAW resonator would provide a multi-band resonator operating at non-harmonically related frequencies, which could be in the gigahertz range. These types of devices could be useful in multi-band communication filter applications. Further, the advantages of a multi-mode device could be significant in bio sample analyses, especially because the TSM is desirable for liquid-phase sensing while the TEM is applicable in vapor-phase sensing. While devices operating in both the TSM and TEM have been created with devices employing an inclined/tilted c-axis growth of ZnO (as opposed to substantially c-axis oriented), these devices require sophisticated deposition and etching processes and have membrane structures that are inherently fragile when dealing in the GHz range due to the necessity of an extremely thin film.

Therefore, there is a desire for durable and more easily manufacturable solidly mounted BAW resonators capable of simultaneously operating in at least two non-harmonically-related modes. Various embodiments of the present invention address such a desire.

BRIEF SUMMARY OF THE INVENTION

The present invention relates to BAW resonators and methods of using such resonators. An exemplary embodiment of the present invention provides a BAW resonator comprising an acoustic reflector, a hexagonal crystal structure, and a plurality of electrodes positioned about the hexagonal crystal structure. The hexagonal crystal can be grown or sputtered on the solidly-mounted acoustic reflector. In an exemplary embodiment of the present invention, the hexagonal crystal structure is a substantially c-axis oriented hexagonal crystal structure. The BAW resonator is configured such that it is resonating in at least two non-harmonically-related operational modes. In an exemplary embodiment of the present invention, the at least two non-harmonically-related operational modes comprise the TSM operating at a first resonant frequency and the TEM operating at a second resonant frequency. The two resonant frequencies are non-harmonically-related to each other. In another exemplary embodiment of the present invention, the at least two non-harmonically-related operational modes further comprises a hybrid mode operating at a third resonant frequency. The third resonant frequency is non-harmonically related to the first and second resonant frequencies. The third resonant frequency can be greater than the first resonant frequency, and the second resonant frequency can be greater than the third resonant frequency. In yet another exemplary embodiment of the present invention, the acoustic reflector comprises at least two alternating layers of a first material and a second material. In some embodiments of the present invention, the second material can have an acoustic impedance greater than the first material.

In various embodiments of the present invention, the plurality of electrodes can have many different configurations. In an exemplary embodiment of the present invention, the plurality of electrodes comprises a signal electrode, a first ground electrode, and a second ground electrode. The signal electrode is positioned substantially on a surface of the hexagonal crystal structure. The first ground electrode is positioned substantially on the surface of the hexagonal crystal structure and adjacent the signal electrode. The second ground electrode is positioned substantially on the surface of the hexagonal crystal structure and adjacent the signal electrode.

In another exemplary embodiment of the present invention, the plurality of electrodes comprises a signal electrode, a first ground electrode, and a second ground electrode. The a signal electrode is positioned on a surface of the acoustic reflector, such that at least a portion of the signal electrode is substantially between at least a portion of the acoustic reflector and at least a portion of the hexagonal crystal structure. The first ground electrode is positioned on the surface of the acoustic reflector, such that at least a portion of the first ground electrode is substantially between at least a second portion of the acoustic reflector and at least a second portion of the hexagonal crystal structure. The second ground electrode is positioned on the surface of the acoustic reflector, such that at least a portion of the second ground electrode is substantially between at least a third portion of the acoustic reflector and at least a third portion of the hexagonal crystal structure. The BAW resonator can further comprise a floating plate positioned about a surface of the hexagonal crystal structure.

In yet another exemplary embodiment of the present invention, the plurality of electrodes comprises a signal electrode and a first ground electrode. The signal electrode is positioned substantially on a surface of the hexagonal crystal structure. The first ground electrode is positioned on a surface of the acoustic reflector, such that the first ground electrode is substantially between at least a portion of the acoustic reflector and at least a portion of the hexagonal crystal structure. In still yet another exemplary embodiment of the present invention, the plurality of electrodes further comprises a second ground electrode positioned on the surface of the acoustic reflector, such that the second ground electrode is substantially between at least a second portion of the acoustic reflector and at least a second portion of the hexagonal crystal structure.

In addition to BAW resonators, the present invention also provides methods of using a BAW resonator. In an exemplary embodiment of the present invention, the method comprises resonating the BAW resonator at a first operational mode with a first resonant frequency and resonating the BAW resonator at a second operational mode with a second resonant frequency. The first resonant frequency and the second resonant frequency are non-harmonically-related. In another exemplary embodiment of the present invention, the first operational mode is the TSM and the second operational mode is the TEM. In yet another exemplary embodiment of the present invention, the method further comprises resonating the BAW resonator at a third operational mode having a third resonant frequency, wherein the third resonant frequency is non-harmonically related to the first and second resonant frequencies. The third operational mode can be a hybrid mode. The hybrid mode can be described as a coupling between the shear and longitudinal waves.

The methods of using the BAW resonator can be applied to several fields, including, but not limited to, liquid sensing, vapor sensing, communications, filters, and the like. Thus, in an exemplary embodiment of the present invention, the method of using a BAW comprises exposing at least a portion of the BAW resonator to a liquid to assist in determining a characteristic of the liquid. In another exemplary embodiment of the present invention, the method of using a BAW resonator comprises exposing at least a portion of the BAW resonator to a vapor to assist in determining a characteristic of the vapor.

These and other aspects of the present invention are described in the Detailed Description of the Invention below and the accompanying figures. Other aspects and features of embodiments of the present invention will become apparent to those of ordinary skill in the art upon reviewing the following description of specific, exemplary embodiments of the present invention in concert with the figures. While features of the present invention may be discussed relative to certain embodiments and figures, all embodiments of the present invention can include one or more of the features discussed herein. While one or more embodiments may be discussed as having certain advantageous features, one or more of such features may also be used with the various embodiments of the invention discussed herein. In similar fashion, while exemplary embodiments may be discussed below as system or method embodiments, it is to be understood that such exemplary embodiments can be implemented in various devices, systems, and methods of the present invention.

BRIEF DESCRIPTION OF THE DRAWINGS

The following Detailed Description of the Invention is better understood when read in conjunction with the appended drawings. For the purposes of illustration, there is shown in the drawings exemplary embodiments, but the subject matter is not limited to the specific elements and instrumentalities disclosed.

DETAILED DESCRIPTION OF THE INVENTION

To facilitate an understanding of the principles and features of the present invention, various illustrative embodiments are explained below. In particular, the invention is described in the context of being BAW resonators and methods of using the same. Embodiments of the present invention may find applications in many fields, including, but not limited to, vapor sensing, liquid sensing, communication systems, filter applications, and the like.

The components described hereinafter as making up various elements of the invention are intended to be illustrative and not restrictive. Many suitable components or steps that would perform the same or similar functions as the components or steps described herein are intended to be embraced within the scope of the invention. Such other components or steps not described herein can include, but are not limited to, for example, similar components or steps that are developed after development of the invention.

Figure 1:
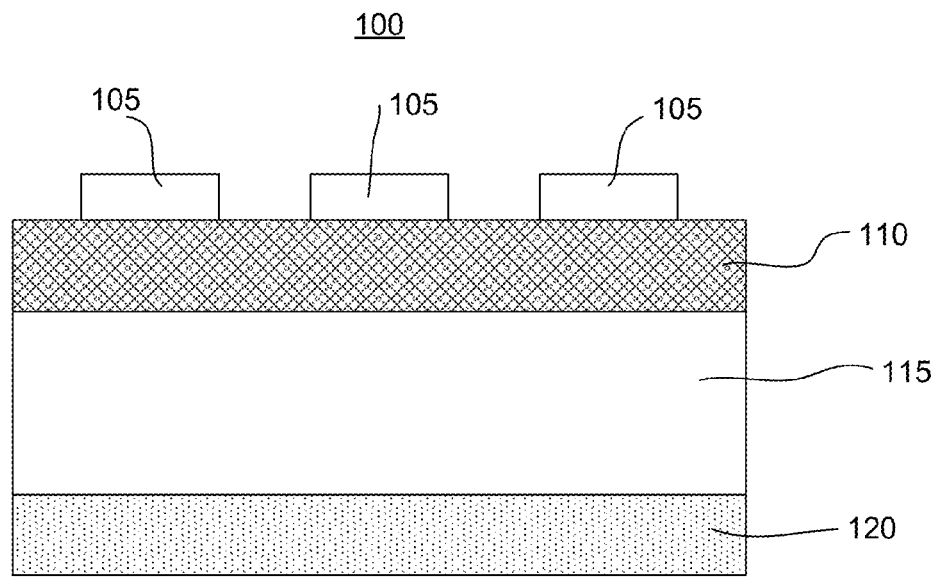
FIG. 1 provides a BAW resonator, in accordance with an exemplary embodiment of the present invention.

As shown in FIG. 1, an exemplary embodiment of the present invention provides a BAW resonator 100 comprising an acoustic reflector 115, a hexagonal crystal structure 110 solidly-mounted on the acoustic reflector 115, and a plurality of electrodes 105 positioned about the hexagonal crystal structure 110. The acoustic reflector 115 can be positioned on a substrate 120, e.g. silicon substrate. The scope of the present invention, however, is not limited to a silicon substrate. In some embodiments of the present invention, the design of the acoustic reflector can be such that the hexagonal crystal structure 110 is not perturbed by the substrate properties; thus, various embodiments of the present invention may be applied to other substrate materials, including, but not limited to, GaAs, superlattice structures, integrated optics materials, such as $LiNbO_3$, and the like. In an exemplary embodiment, the BAW resonator 100 resonates in at least two non-harmonically-related operational modes. In another exemplary embodiment of the present invention, the BAW resonator 100 resonates in at least three non-harmonically-related operational modes.

Figure 2:
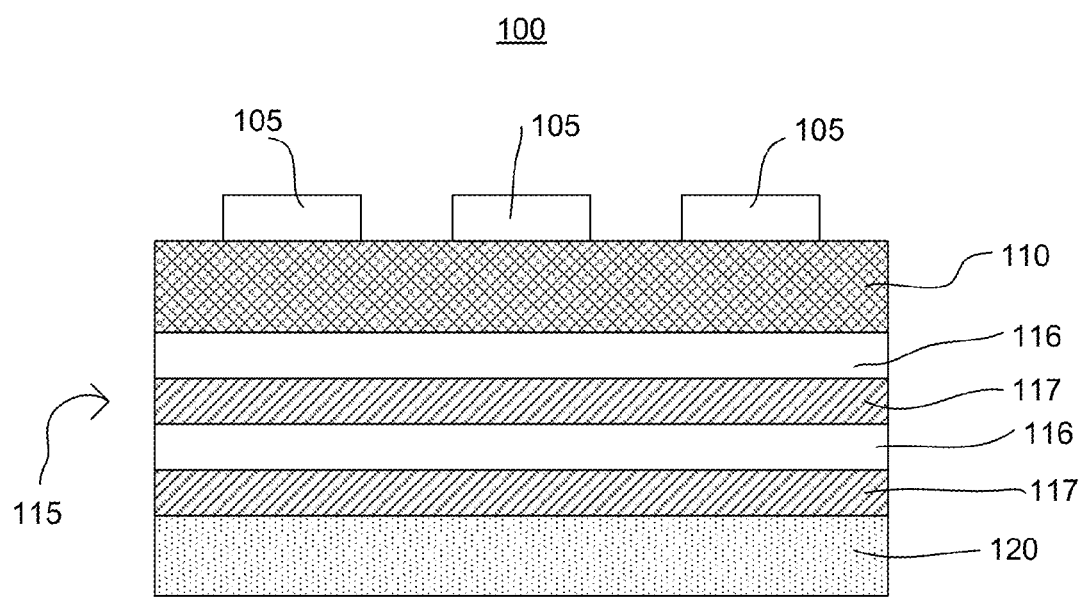
FIG. 2 provides a BAW resonator with an acoustic reflector comprising alternating layers of a first material and a second material, in accordance with an exemplary embodiment of the present invention.

The acoustic reflector 115 can be many different acoustic reflectors. In an exemplary embodiment of the present invention, the acoustic reflector 115 comprises at least two alternating layers of a first material 116 and a second material 117. In some embodiments of the present invention, the second 117 material can have an acoustic impedance greater than the first material 116. In some embodiments of the present invention, the first material 116 can have an acoustic impedance greater than the second material 117. In accordance with an exemplary embodiment of the present invention, FIG. 2 provides a cross-sectional view of a BAW resonator 100 with alternating layers of a first material 116 and a second material 117. In an exemplary embodiment of the present invention the first material 116 is tungsten and the second material 117 is silicon-dioxide. The scope of the present invention, however, is not limited to a reflector 115 comprising tungsten and silicon-dioxide. Instead, the reflector 115 of the present invention can comprise many different materials.

In an exemplary embodiment of the present invention, the acoustic reflector 115 can be constructed by a stack of quarter wavelength thick materials. The scope of the present invention, however, is not limited to materials with a quarter wavelength thickness. Instead, the materials can have many different thicknesses dependent on desired specifications for the resonator 100. The reflector 115 can provide acoustic isolation by approximating air boundary at the interface between the hexagonal crystal structure 110 and reflector 115. Each material 116, 117 in the reflector 115 can be modeled as a transmission line. For an exemplary reflector 115 of alternating low and high impedance quarter-wavelength layers deposited on a Si wafer substrate 120, the net $Z_{in}$ for an acoustic wave incident on the crystal-reflector boundary can be represented by Equation 1.

$$Z_{in} = Z_l, \frac{Z_l}{Z_h}, \frac{Z_l}{Z_h}, \frac{Z_l}{Z_h}, \frac{Z_{Si}}{Z_h} \quad \text{Equation 1}$$

If the ratio of $Z_L$ to $Z_H$ is less than one, then the input impedance seen by the acoustic wave will go towards zero approximating air at the crystal-reflector boundary, and thus provides acoustic isolation from the substrate 120. The acoustic impedance for the TSM is given by $Z_{sh}=\sqrt{(\rho^*c_{44})}$, whereas for the TEM, $Z_l=\sqrt{(\rho^*c_{33})}$, where $\rho$ is the mass density and c is the stiffness constant in the material for the type of wave propagating along the c-axis, either shear or longitudinal. Because the acoustic impedance is a function of the stiffness coefficient, each material offers different impedance to different types of waves. Because the acoustic wave velocity is also dependent on c, the frequencies of propagation of TSM and TEM are different. Hence the same set of reflector layers can reflect both the TSM and TEM waves at different frequencies. A judicious choice of the resonator thickness can then be made to establish the TSM and TEM within the reflector bandwidth for each mode respectively.

Figure 3:
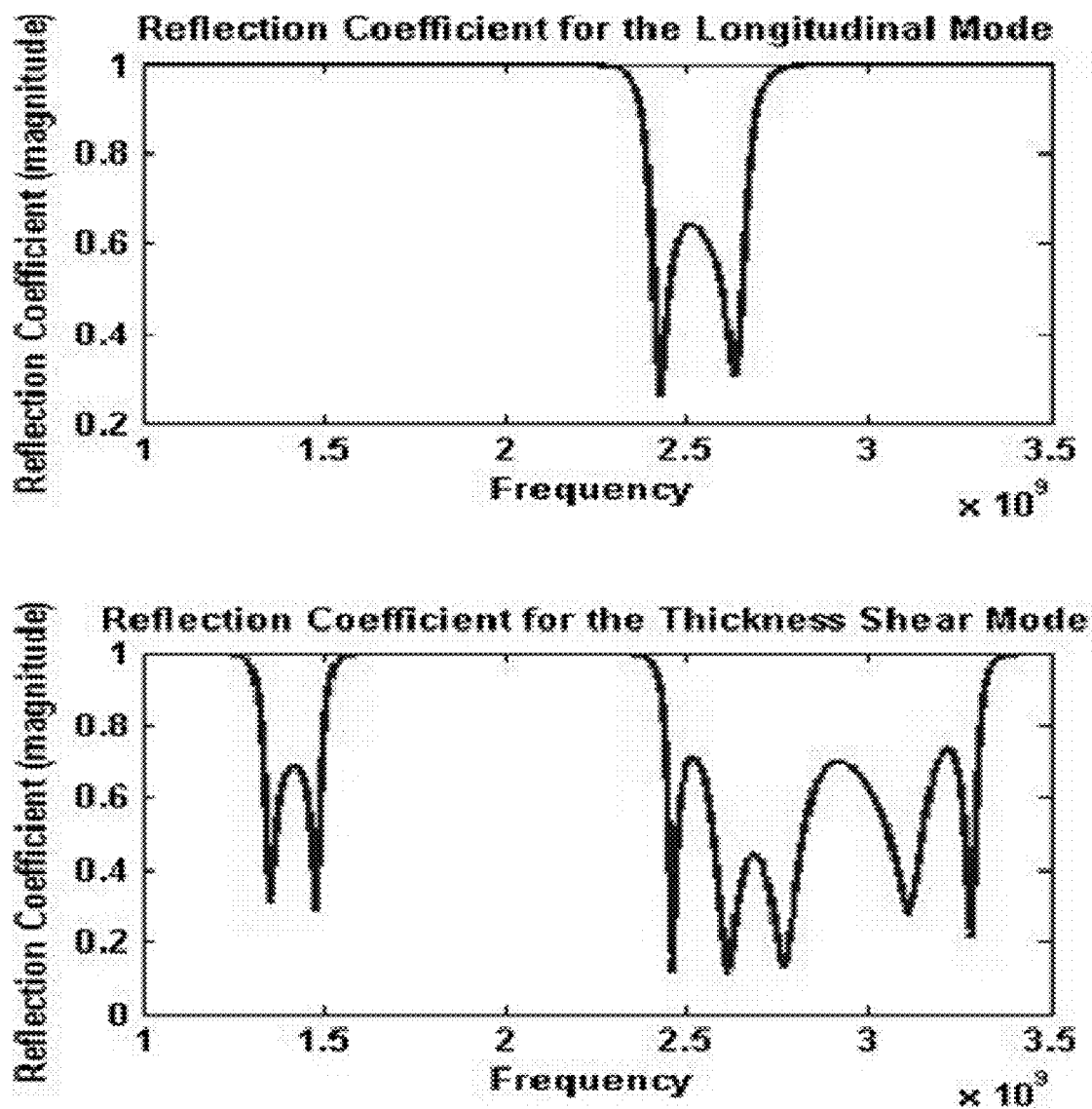
FIG. 3 provides a plot of exemplary reflection coefficients of the TEM and TSM in a BAW resonator, in accordance with an exemplary embodiment of the present invention.

The quarter-wavelength thickness of each layer in the reflector 115 in an exemplary resonator 100 of the present invention can be chosen to give a reflectance band in the gigahertz range for both TSM and TEM simultaneously. The resulting exemplary reflection coefficients are shown in FIG. 3. It is evident from these results that this exemplary resonator 100 resonates in both the TSM and TEM in the GHz range. Thus, the exemplary resonator 100 resonates in at least two non-harmonically-related operational modes.

Figure 4:
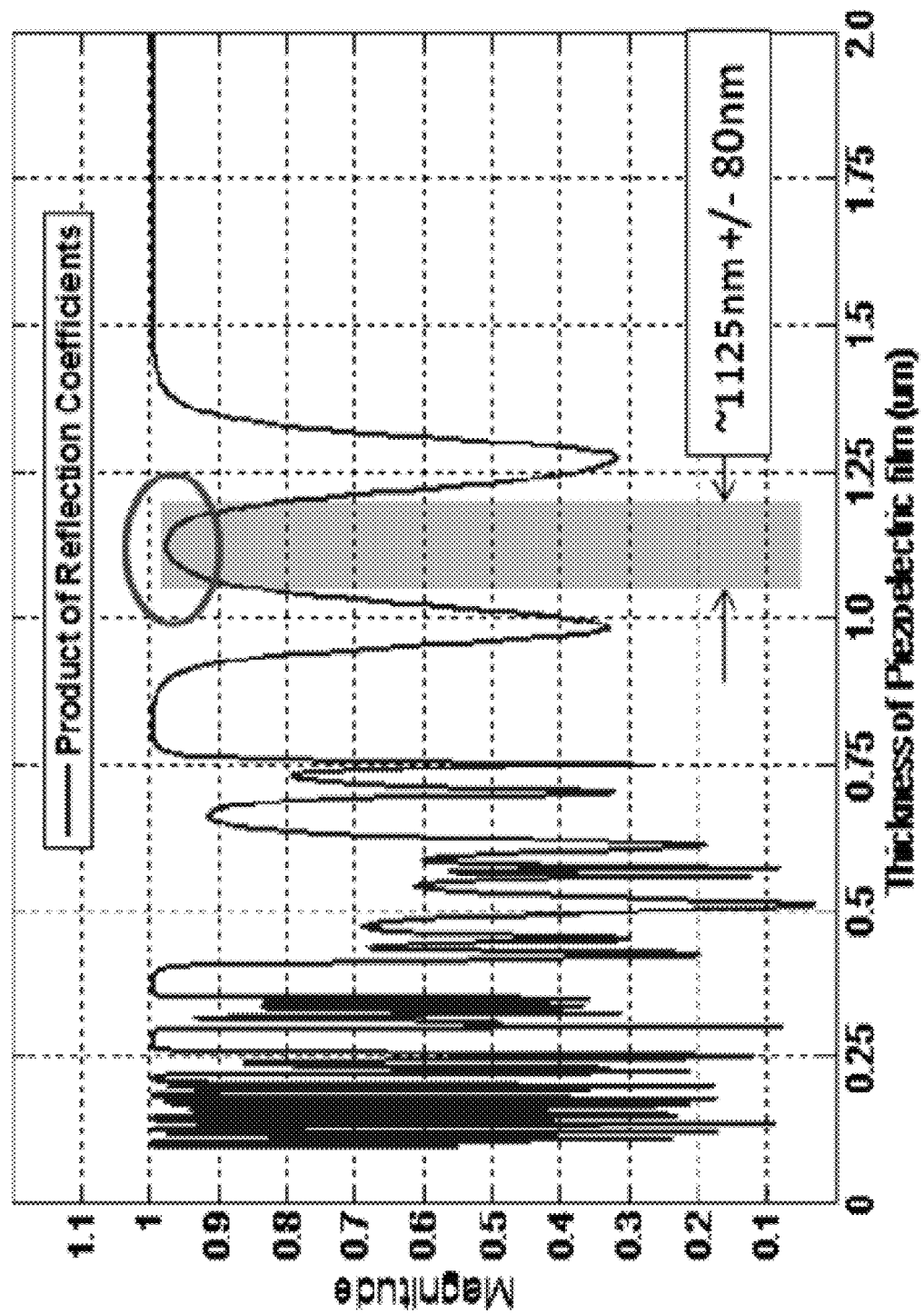
FIG. 4 provides a combined TSM and TEM reflector response in a BAW resonator, in accordance with an exemplary embodiment of the present invention.

The hexagonal crystal structure 110 can be many different materials known in the art. In an exemplary embodiment of the present invention, the hexagonal crystal structure 110 is a piezoelectric hexagonal crystal structure. In some embodiments of the present invention, the hexagonal crystal structure 110 is a substantially c-axis oriented hexagonal crystal structure. A substantially c-axis oriented crystal structure can have many advantages over non-substantially c-axis oriented crystal structures, e.g. c-axis that is tilted with respect to surface normal, such as less complicated deposition and etching processes. In some embodiments of the present invention, the hexagonal crystal structure 110 can comprise zinc-oxide (ZnO). The hexagonal crystal structure can have many different thicknesses, which may be determined based on desired specifications of the BAW resonator 100. In order to calculate the appropriate crystal structure thickness to accommodate both the TSM and TEM, the efficiency of the reflector 115 in supporting both modes at a given crystal structure thickness is determined. The reflector response can be calculated as a function of crystal structure thickness, d (rather than frequency: $d=V/2f_0$). In accordance with an exemplary embodiment of the present invention, the two reflector responses, discussed above, can then be multiplied together (equivalent to a logical AND operation on the responses), and the result is plotted in FIG. 4. This plot offers a metric by which to determine the reflection efficiency for both the TSM and TEM at a given crystal structure thickness; the closer this product is to 1, the more efficient the reflector will be in supporting both the TSM and TEM. As shown in the shaded area of the plot, for an exemplary embodiment of the present invention, a crystal structure thickness of approximately 1125+/−80 nm is targeted. In choosing the crystal structure thickness using FIG. 4, the multi-mode support of the device can be optimized.

Figure 11:
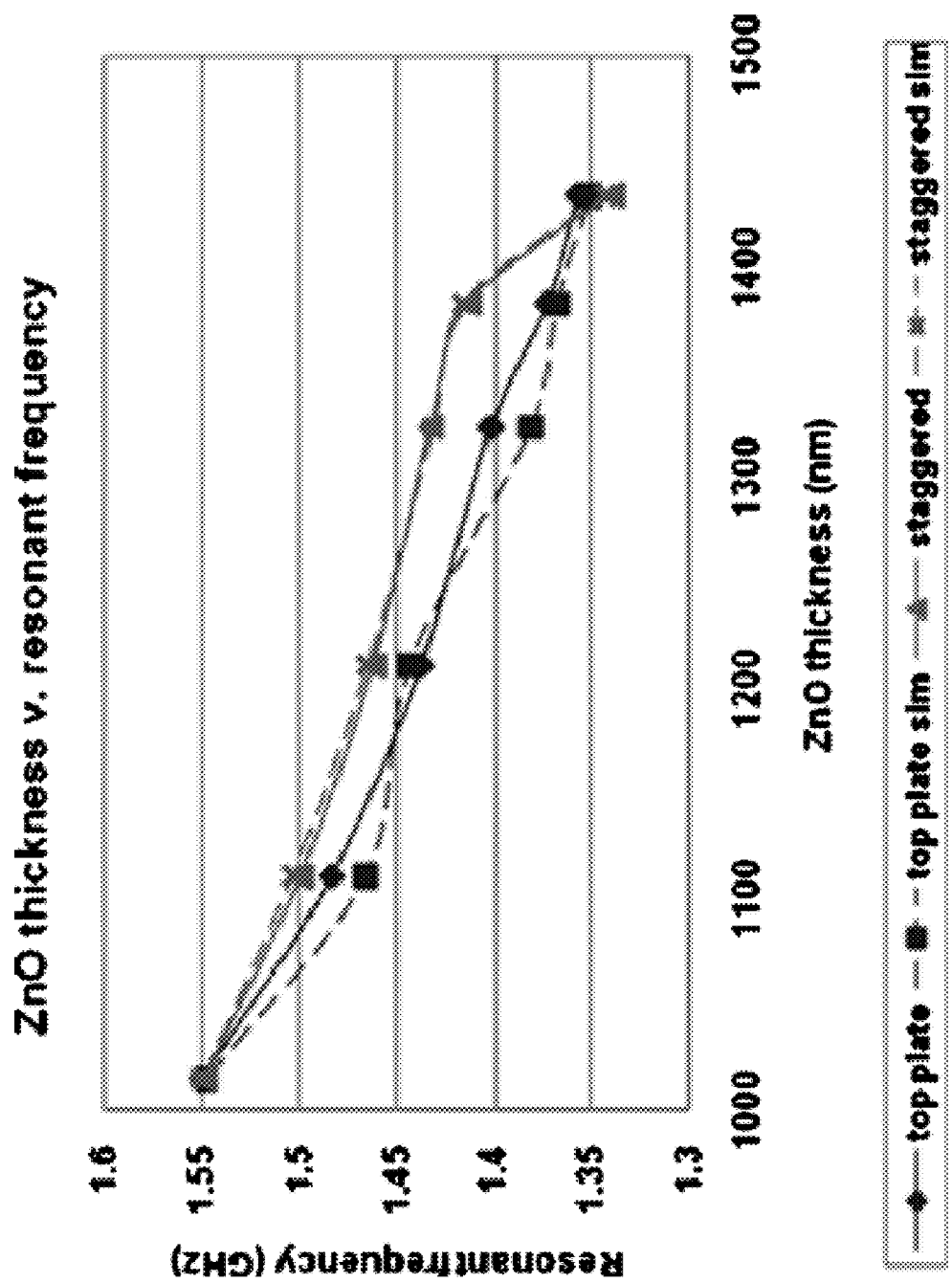
FIG. 11 provides a plot of crystal structure thickness versus resonant frequency for BAW resonators resonating in a hybrid mode, in accordance with exemplary embodiments of the present invention.
Figure 12:
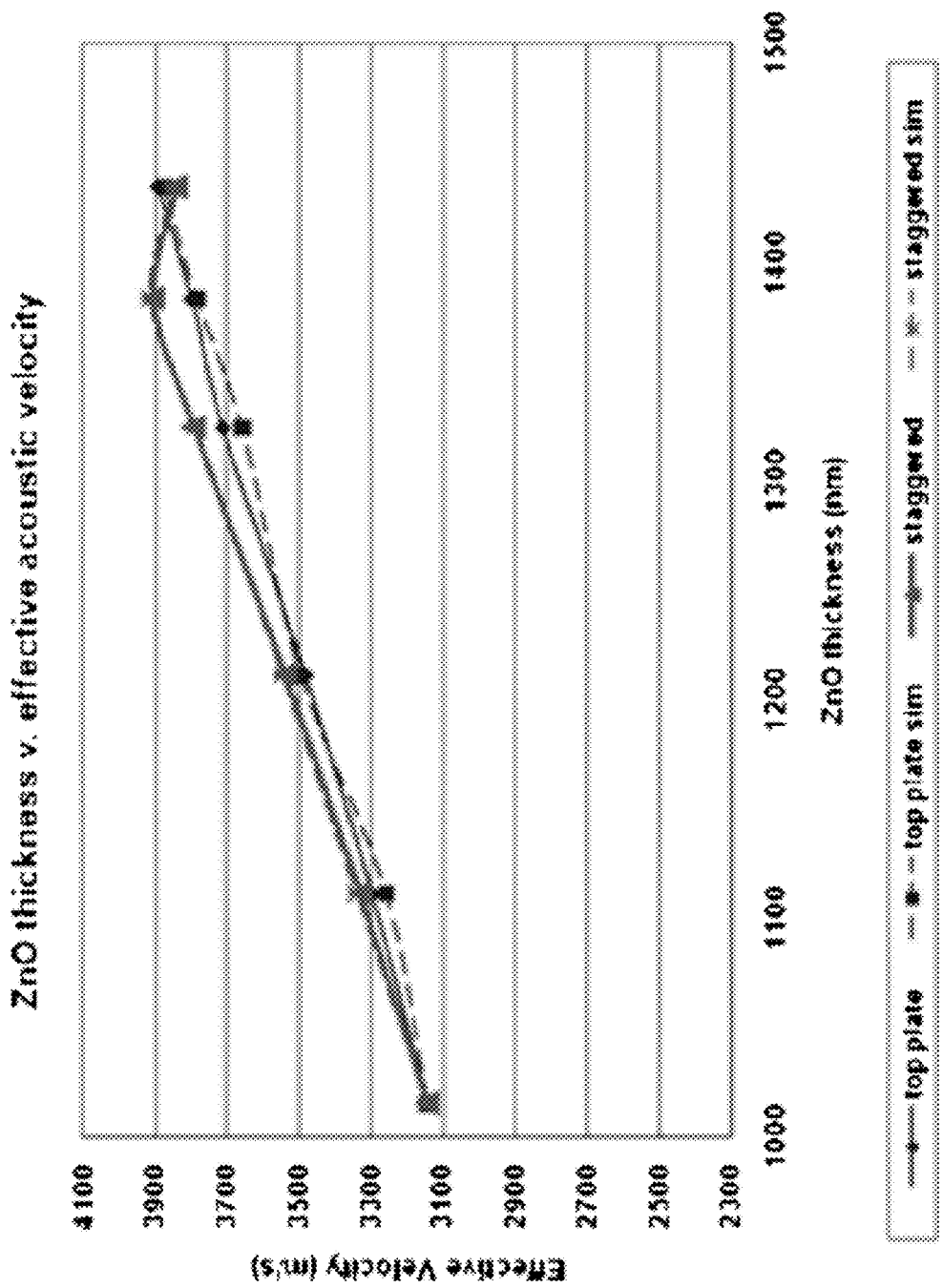
FIG. 12 provides a plot of crystal structure thickness versus acoustic velocity for BAW resonators resonating in a hybrid mode, in accordance with exemplary embodiments of the present invention.

In some embodiments of the present invention, the resonant frequencies and acoustic velocities can vary with varying thickness of the crystal structure 110. Table 1 provides simulated and measured resonant frequencies and acoustic velocities for varying thicknesses of crystal structures 110 in exemplary embodiments of the present invention operating in a hybrid mode. In some embodiments of the present invention, as shown in FIGS. 11 and 12, the resonant frequency decreases with increasing crystal structure thickness, and the acoustic velocity increases with increasing crystal structure thickness.

TABLE 1

Simulated and Measured Resonant Frequencies and Acoustic Velocities for Varying Thicknesses of Crystal Structures of Exemplary BAW Resonators

| Crystal Structure Thickness | Simulated | | Measured | | Agreement |
|---|---|---|---|---|---|
| (nm) | GHz | m/s | GHz | m/s | % |
| BAW Resonators with a Floating Plate | | | | | |
| 1015 | 1.5476 | 3141 | 1.5496 | 3145 | 0.15 |
| 1111 | 1.4658 | 3257 | 1.4834 | 3296 | 1.18 |
| 1211 | 1.4430 | 3495 | 1.4374 | 3481 | 0.4 |
| 1324 | 1.3811 | 3657 | 1.4016 | 3711 | 1.46 |
| 1383 | 1.3678 | 3783 | 1.3731 | 3797 | 0.39 |
| 1434 | 1.3507 | 3873 | 1.357 | 3891 | 0.46 |
| BAW Resonators with a Staggered Electrode Configuration | | | | | |
| 1015 | 1.5497 | 3146 | 1.5482 | 3143 | 0.09 |
| 1111 | 1.5034 | 3341 | 1.4991 | 3331 | 0.29 |
| 1211 | 1.4645 | 3547 | 1.4614 | 3540 | .021 |
| 1324 | 1.4308 | 3789 | 1.4322 | 3792 | 0.1 |
| 1383 | 1.4153 | 3915 | 1.4123 | 3906 | 0.21 |
| 1434 | 1.3430 | 3852 | 1.3398 | 3843 | 0.24 |

Figure 5:
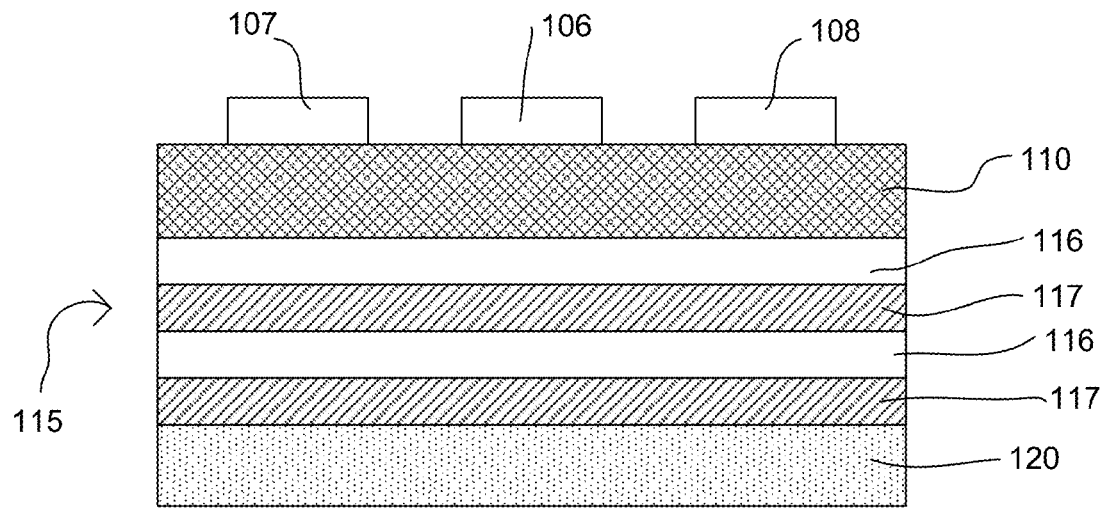
FIG. 5 provides a BAW resonator with a first exemplary electrode configuration, in accordance with an exemplary embodiment of the present invention.

The plurality of electrodes 105 of the BAW resonator 100 can be arranged in many different configurations in accordance with various embodiments of the present invention. FIG. 5 illustrates a BAW resonator 100 with a first electrode configuration in accordance with an exemplary embodiment of the present invention. The plurality of electrodes 105 comprises a signal electrode 106, a first ground electrode 107, and a second ground electrode 108. The signal electrode 106 is positioned substantially on a surface of the hexagonal crystal structure 110. The first ground electrode 107 is positioned substantially on the surface of the hexagonal crystal structure 110 and adjacent the signal electrode 106. The second ground electrode 108 is positioned substantially on the surface of the hexagonal crystal structure 110 and adjacent the signal electrode 106.

Figure 6:
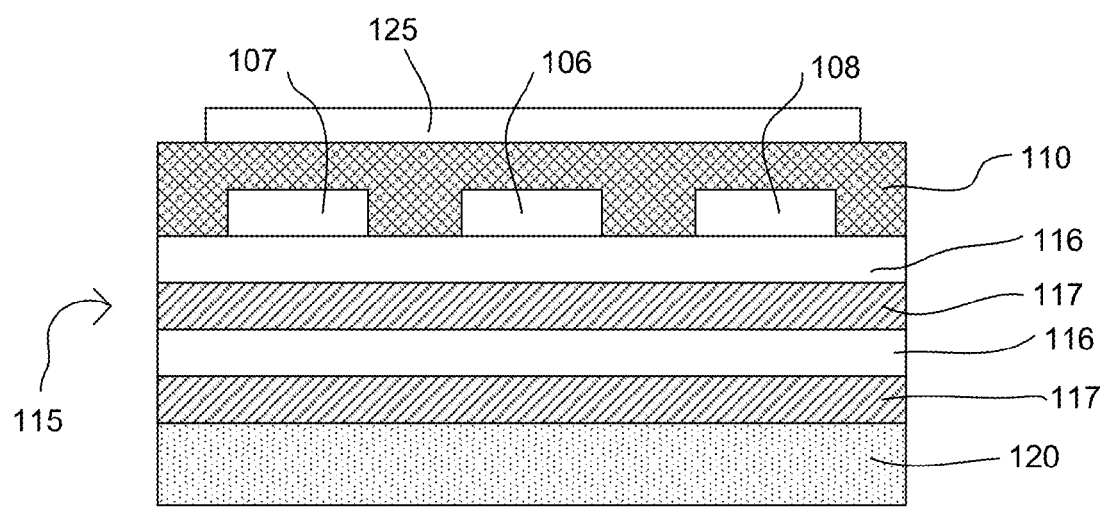
FIG. 6 provides a BAW resonator with a second exemplary electrode configuration, in accordance with an exemplary embodiment of the present invention.

FIG. 6 illustrates a BAW resonator 100 with a second electrode configuration in accordance with an exemplary embodiment of the present invention. The plurality of electrodes 105 comprises a signal electrode 106, a first ground electrode 107, and a second ground electrode 108. The signal electrode 106 is positioned on a surface of the acoustic reflector 115, such that at least a portion of the signal electrode 106 is substantially between at least a portion of the acoustic reflector 115 and at least a portion of the hexagonal crystal structure 110. A first ground electrode 107 is positioned on the surface of the acoustic reflector 115, such that at least a portion of the first ground electrode 107 is substantially between at least a second portion of the acoustic reflector 115 and at least a second portion of the hexagonal crystal structure 110. The second ground electrode 108 is positioned on the surface of the acoustic reflector 115, such that at least a portion of the second ground electrode 108 is substantially between at least a third portion of the acoustic reflector 115 and at least a third portion of the hexagonal crystal structure 110. In an exemplary embodiment of the present invention where the second electrode configuration is employed, the BAW resonator 100 further comprises a floating plate 125 positioned proximate a surface of the hexagonal crystal structure 115. As those skilled in the art would understand, the floating plate can comprise many different materials. In an exemplary embodiment of the present invention, the floating plate comprises tungsten.

Figure 7:
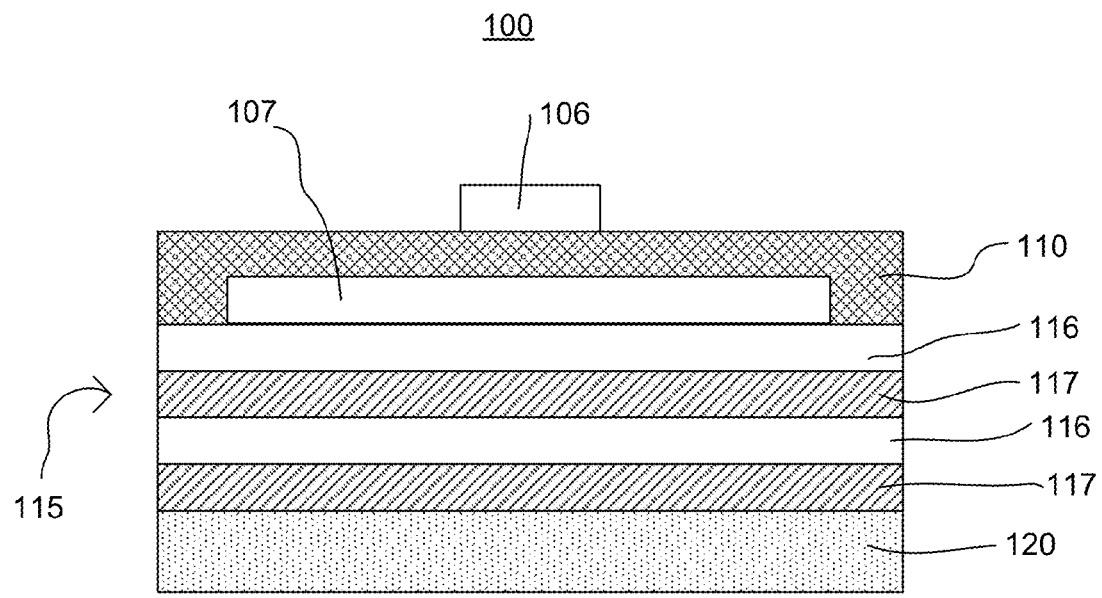
FIG. 7 provides a BAW resonator with a third exemplary electrode configuration, in accordance with an exemplary embodiment of the present invention.

FIG. 7 illustrates a BAW resonator 100 with a third electrode configuration in accordance with an exemplary embodiment of the present invention. The plurality of electrodes 105 comprises a signal electrode 106 and a first ground electrode 107. The signal electrode 106 is positioned substantially on a surface of the hexagonal crystal structure 110. The first ground electrode 107 is positioned on a surface of the acoustic reflector 108, such that the first ground electrode 107 is substantially between at least a portion of the acoustic reflector 115 and at least a portion of the hexagonal crystal structure 110.

Figure 8:
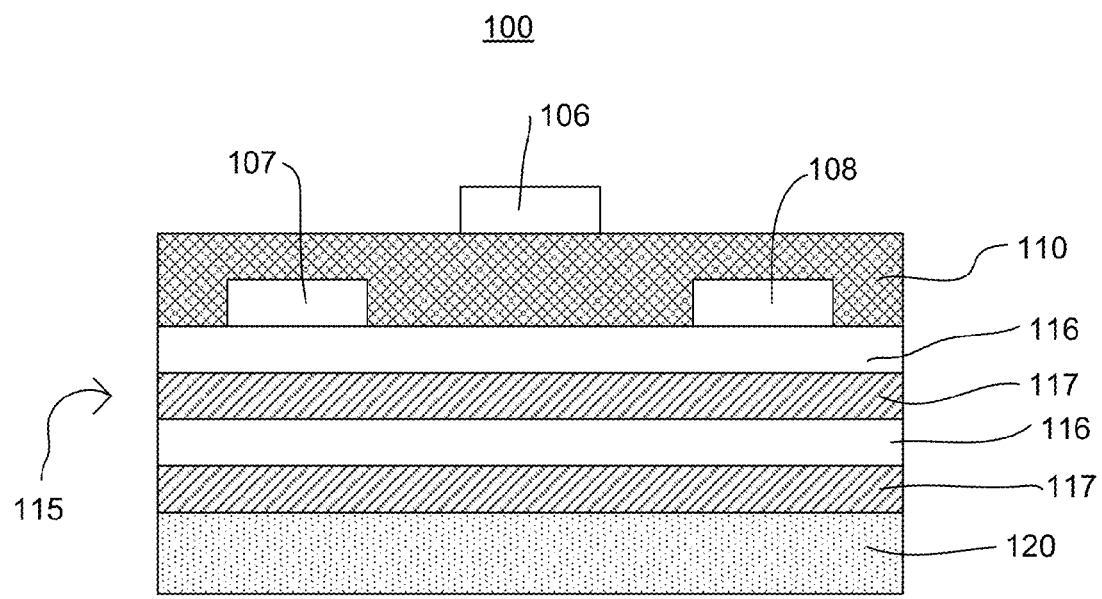
FIG. 8 provides a BAW resonator with a fourth exemplary electrode configuration, in accordance with an exemplary embodiment of the present invention.

FIG. 8 illustrates a BAW resonator 100 with a fourth electrode configuration in accordance with an exemplary embodiment of the present invention. The plurality of electrodes 105 comprises a signal electrode 106, a first ground electrode 107, and a second ground electrode 108. The signal electrode 106 is positioned substantially on a surface of the hexagonal crystal structure 110. The first ground electrode 107 is positioned on a surface of the acoustic reflector 115, such that the first ground electrode 107 is substantially between at least a portion of the acoustic reflector 115 and at least a portion of the hexagonal crystal structure 110. The second ground electrode 108 is positioned on the surface of the acoustic reflector 115, such that the second ground electrode 108 is substantially between at least a second portion of the acoustic reflector 115 and at least a second portion of the hexagonal crystal structure 110.

As discussed above, in some embodiments of the present invention, a BAW resonator 100 can resonate in at least three non-harmonically-related operational modes. In an exemplary embodiment of the present invention, a BAW resonator 100 resonates in the TSM, the TEM, and a hybrid mode. The hybrid mode can be described as a coupling between the shear and longitudinal waves. In some embodiments of the present invention, the hybrid mode operates at a resonant frequency between the resonant frequencies of the TSM and TEM. The resonant frequencies of the TSM, TEM, and hybrid mode are non-harmonically-related.

Figure 9:
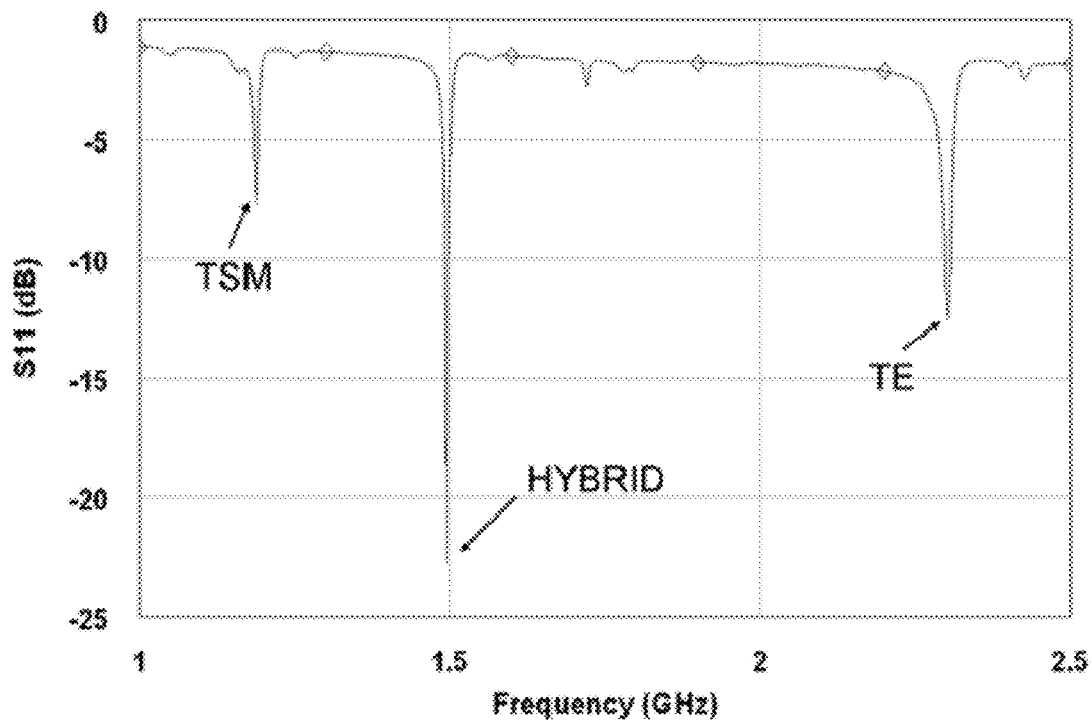
FIG. 9 provides the measured frequency response for a BAW resonator, in accordance with an exemplary embodiment of the present invention.

Table 2 provides a measure of the quality factors, resonant frequencies, and acoustic velocities for an exemplary BAW resonator 100 of the present invention resonating in the TSM, TEM, and hybrid mode. Additionally, the frequency response of this exemplary embodiment of the present invention is provided in FIG. 9.

TABLE 2

Measured Quality factors, resonant frequencies, and acoustic velocities of TSM, TEM, and hybrid mode in an exemplary embodiment of the present invention.

| | Quality Factor | | Avg. Resonant | Acoustic |
|---|---|---|---|---|
| Mode Type | Average | Range | Freq. (GHz) | Velocity (m/s) |
| TSM | 480 | 400-500 | 1.2 | ~2600 |
| Hybrid | 700 | 500-800 | 1.52 | ~3320 |
| TEM | 910 | 800-1000 | 2.3 | ~5100 |

Figure 10:
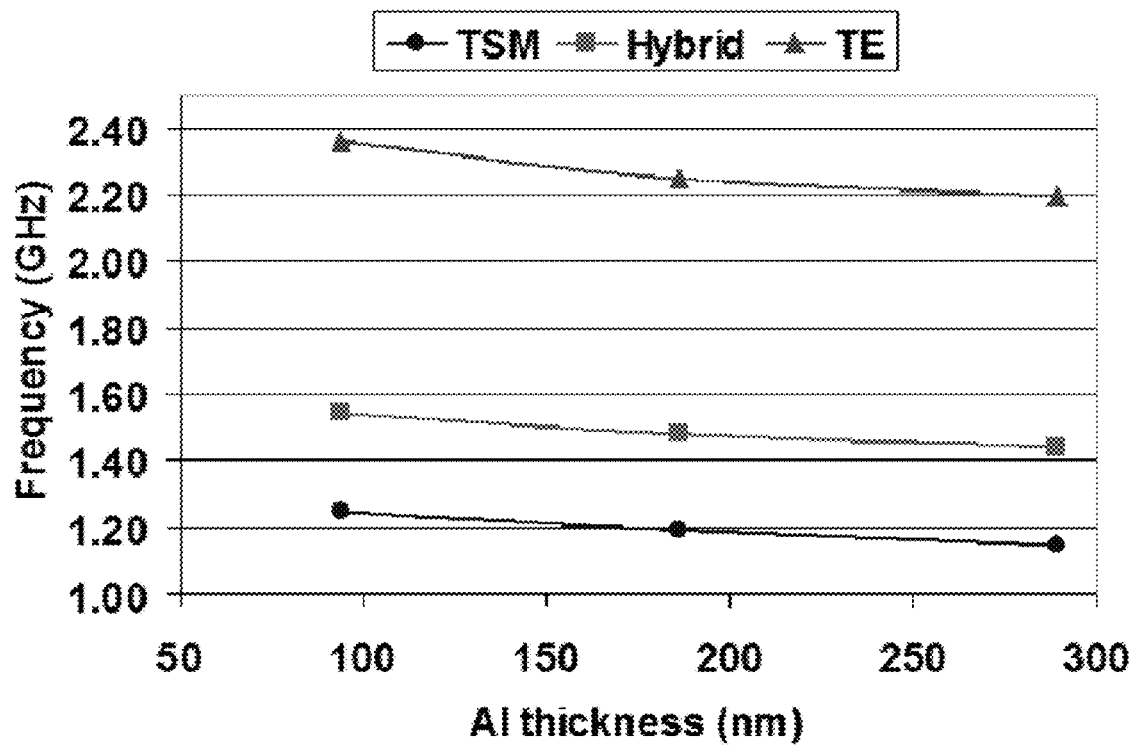
FIG. 10 provides a plot of the electrode thickness versus resonant frequency for BAW resonators, in accordance with exemplary embodiments of the present invention.

In some embodiments of the present invention, the TEM in a thickness excitation configuration experiences energy trapping beneath the top electrode. The off axis excitation of the TSM can occur outside the top electrode but inertial loading effects can trap the TSM wave beneath the top electrode. The effect is verified by testing various BAW resonators 100 of the present invention with varying electrode thicknesses. As illustrated in FIG. 10, in some embodiments of the present invention, the resonant frequencies of the TEM, TSM, and hybrid mode decrease with mass-loading on the top electrode, thus indicative of energy trapping under the top electrode.

In addition to BAW resonators 100, the present invention provides methods of using BAW resonators 100. An exemplary embodiment of the present invention provides a method of using a BAW resonator 100 comprising resonating the BAW resonator 100 at a first operational mode with a first resonant frequency, and resonating the BAW resonator 100 at a second operational mode with a second resonant frequency. The first resonant frequency and the second resonant frequency are non-harmonically-related. The first operational mode can be the TSM, and the second operational mode can be the TEM. In another embodiment of the present invention, the method of using a BAW resonator 100 further comprises resonating the BAW resonator 100 at a third operational mode having a third resonant frequency wherein the third resonant frequency is non-harmonically related to the first and second resonant frequencies. The third operational mode can be a hybrid mode.

As previously discussed, BAW resonators 100 of the present invention find applications in many different fields. Thus, in an exemplary embodiment of the present invention, the method of using the BAW resonator 100 comprises exposing at least a portion of the BAW resonator 100 to a liquid to assist in determining a characteristic of the liquid. In another exemplary embodiment of the present invention, the method of using the BAW resonator 100 comprises exposing at least a portion of the BAW resonator 100 to a vapor to assist in determining a characteristic of the liquid. In still yet another exemplary embodiment of the present invention, the method of using the BAW resonator 100 comprises placing the BAW resonator 100 in a communication system to create a filter.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. It is intended that the application is defined by the claims appended hereto.

What is claimed is:

1. A bulk-acoustic-wave resonator, comprising:
   an acoustic reflector;
   a substantially c-axis oriented hexagonal crystal structure solidly-mounted to the acoustic reflector; and
   a plurality of electrodes positioned about the hexagonal crystal structure,
   wherein the bulk-acoustic-wave resonator is resonating in at least two non-harmonically-related operational modes,
   wherein the plurality of electrodes comprise:
      a signal electrode positioned on a surface of the acoustic reflector, such that at least a portion of the signal electrode is substantially between at least a portion of the acoustic reflector and at least a portion of the hexagonal crystal structure;
      a first ground electrode positioned on the surface of the acoustic reflector, such that at least a portion of the first ground electrode is substantially between at least a second portion of the acoustic reflector and at least a second portion of the hexagonal crystal structure; and
      a second ground electrode positioned on the surface of the acoustic reflector, such that at least a portion of the second ground electrode is substantially between at least a third portion of the acoustic reflector and at least a third portion of the hexagonal crystal structure.

2. The bulk-acoustic-wave resonator of claim 1, wherein the acoustic reflector comprises at least two alternating layers of a first material and a second material, wherein the second material has an acoustic impedance greater than the first material.

3. The bulk-acoustic-wave resonator of claim 1, wherein the at least two non-harmonically-related operational modes comprise:
   a thickness-shear mode operating at a first resonant frequency; and
   a longitudinal-thickness-extension mode operating at a second resonant frequency, wherein the first resonant frequency is non-harmonically-related to the second resonant frequency.

4. The bulk-acoustic-wave resonator of claim 3, wherein the at least two-non-harmonically-related operational modes further comprise a hybrid mode operating at a third resonant frequency, wherein the third resonant frequency is non-harmonically related to the first and second resonant frequencies.

5. The bulk-acoustic-wave resonator of claim 4, wherein the third resonant frequency is greater than the first resonant frequency and the second resonant frequency is greater than the third resonant frequency.

6. The bulk-acoustic-wave resonator of claim 1, further comprising a floating plate positioned on a surface of the hexagonal crystal structure.

7. The bulk-acoustic-wave resonator of claim 1, wherein the hexagonal crystal structure is a piezoelectric hexagonal crystal structure.

8. A bulk-acoustic-wave resonator, comprising:
   an acoustic reflector;
   a hexagonal crystal structure solidly-mounted to the acoustic reflector; and
   a plurality of electrodes positioned about the hexagonal crystal structure,
   wherein the bulk-acoustic-wave resonator is resonating in at least three non-harmonically-related operational modes, and wherein the plurality of electrodes comprise:
a signal electrode positioned on a top surface of the acoustic reflector, such that at least a portion of the signal electrode is substantially between at least a portion of the acoustic reflector and at least a portion of the hexagonal crystal structure;
a first ground electrode positioned on the top surface of the acoustic reflector, such that at least a portion of the first ground electrode is substantially between at least a second portion of the acoustic reflector and at least a second portion of the hexagonal crystal structure; and
a second ground electrode positioned on the top surface of the acoustic reflector, such that at least a portion of the second ground electrode is substantially between at least a third portion of the acoustic reflector and at least a third portion of the hexagonal crystal structure.

9. The bulk-acoustic-wave resonator of claim 8, wherein the acoustic reflector comprises at least two alternating layers of a first material and a second material, wherein the second material has an acoustic impedance greater than the first material.

10. The bulk-acoustic-wave resonator of claim 8, wherein the at least three non-harmonically-related operational modes comprise:
a thickness-shear mode operating at a first resonant frequency;
a longitudinal-thickness-extension mode operating at a second resonant frequency, wherein the first resonant frequency is non-harmonically-related to the second resonant frequency; and
a hybrid mode operating at a third resonant frequency, wherein the third resonant frequency is non-harmonically related to the first and second resonant frequencies.

11. The bulk-acoustic-wave resonator of claim 10, wherein the third resonant frequency is greater than the first resonant frequency and the second resonant frequency is greater than the third resonant frequency.

12. The bulk-acoustic-wave resonator of claim 8, further comprising a floating plate positioned on a top surface of the hexagonal crystal structure.

13. The bulk-acoustic-wave resonator of claim 8, wherein the hexagonal crystal structure is a piezoelectric hexagonal crystal structure.

14. A method of using a bulk-acoustic-wave resonator, the bulk-wave resonator comprising an acoustic reflector, a substantially c-axis oriented hexagonal crystal structure solidly-mounted to the acoustic reflector, and a plurality of electrodes positioned about the hexagonal crystal structure, wherein the plurality of electrodes comprises a signal electrode positioned on a top surface of the acoustic reflector, such that at least a portion of the signal electrode is substantially between at least a portion of the acoustic reflector and at least a portion of the hexagonal crystal structure, a first ground electrode positioned on the top surface of the acoustic reflector, such that at least a portion of the first ground electrode is substantially between at least a second portion of the acoustic reflector and at least a second portion of the hexagonal crystal structure, and a second ground electrode positioned on the top surface of the acoustic reflector, such that at least a portion of the second ground electrode is substantially between at least a third portion of the acoustic reflector and at least a third portion of the hexagonal crystal structure, the method comprising:
resonating the bulk-acoustic-wave resonator at a first operational mode with a first resonant frequency; and
resonating the bulk-acoustic-wave resonator at a second operational mode with a second resonant frequency,
wherein the first resonant frequency and the second resonant frequency are non-harmonically related.

15. The method of claim 14, wherein the first operation mode is a thickness-shear-mode and the second operation mode is a longitudinal-thickness-extension mode.

16. The method of claim 14, further comprising resonating the bulk-acoustic-wave resonator at a third operational mode having a third resonant frequency, wherein the third resonant frequency is non-harmonically related to the first and second resonant frequencies.

17. The method of claim 16, wherein the third operation mode is a hybrid mode.

18. The method of claim 14, further comprising exposing at least a portion of the bulk-acoustic-wave resonator to a liquid to assist in determining a characteristic of the liquid.

19. The method of claim 14, further comprising exposing at least a portion of the bulk-acoustic-wave resonator to a vapor to assist in determining a characteristic of the vapor.

20. The method of using a bulk-acoustic-wave resonator of claim 14, wherein the hexagonal crystal structure is a piezoelectric hexagonal crystal structure.

* * * * *